United States Patent [19]

Locker

[11] Patent Number: 4,730,237
[45] Date of Patent: Mar. 8, 1988

[54] CAM-LOCK CIRCUIT BOARD SPACER

[76] Inventor: John C. Locker, 8061 Round Moon Cir., Jessup, Md. 20794

[21] Appl. No.: 913,299

[22] Filed: Sep. 30, 1986

[51] Int. Cl.$^4$ .............................................. H05K 1/14
[52] U.S. Cl. .................................... 361/395; 361/399; 361/412; 361/415; 439/55
[58] Field of Search ............... 361/395, 399, 412, 413, 361/414, 415; 339/17 M, 17 LM

[56] References Cited

U.S. PATENT DOCUMENTS 4,401,351 8/1983 Record .................................. 361/395
4,523,254 6/1985 Konshak ............................... 361/395

Primary Examiner—Robert S. Macon
Attorney, Agent, or Firm—Saul Elbaum; Alan J. Kennedy; Thomas E. McDonald

[57] ABSTRACT

A cam operated spacing device is provided for securing electronic circuit boards to a chasis in spaced parallel relationship to one another and for maintaining this spacing in environments when the circuit boards are subjected to high shock and vibration. The lobes of the cam-lock device are rotated 180° to cause the lobes to engage the edges of apertures in the circuit boards and secure the circuit boards in place.

5 Claims, 6 Drawing Figures

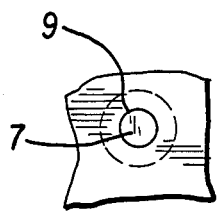
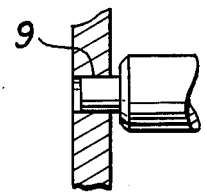
FIG.3a　　　　FIG.3b
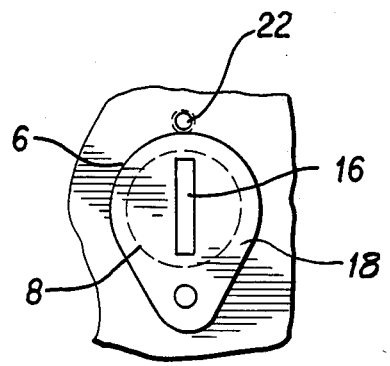
FIG. 4
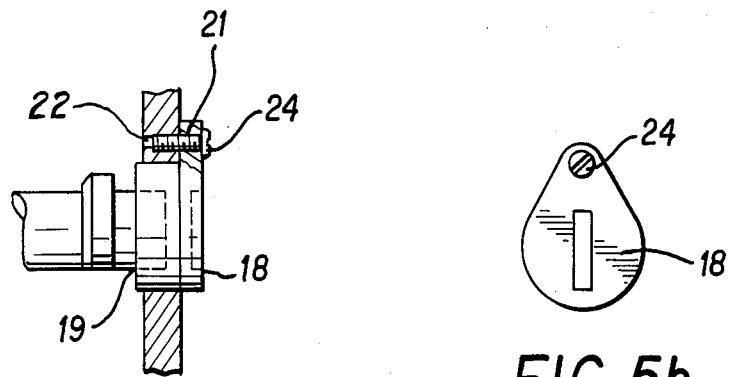
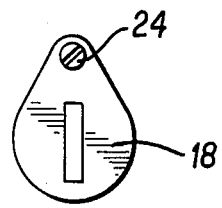
FIG.5a　　　　FIG.5b

CAM-LOCK CIRCUIT BOARD SPACER

RIGHTS OF THE GOVERNMENT

The invention described herein may be manufactured, used or licensed by or for the Government of the United States of America for governmental purposes without payment to me of any royalties thereon.

BACKGROUND OF THE INVENTION

The present invention relates to a mounting device for securing panels such as electronic circuit boards in spaced parallel relationship to one another when assembled in electronic equipment.

In the current state of manufacture of electronic printed circuit boards, it is often desired to securely and accurately mount two or more circuit boards in spaced parallel relationship when assembled in electronic equipment and instumentation. This is a particularly difficult task when the circuit boards are to be installed in military electronic equipment that is exposed to environments in which the equipment will be subjected to conditions of high shock and vibration. The usual method of joining circuit boards is to use spacers of uniform length and screws or other fastener devices to assemble the circuit boards and lock the boards onto the spaces. In these devices, however, the locking members pass through holes in the circuit board, thus requiring such holes to be larger than necessary to allow for clearance for the diameter of the shaft of the locking member passing therethrough. As a consequence, some lateral movement of one circuit board with respect to another is permitted. U.S. Pat. No. 4,444,318 discloses a one-piece snap-in spacing device for mounting two adjacent circuit boards, however, the circuit boards are aligned only in pairs. Hence, there is no provision for aligning three or more circuit boards utilizing one common spacing device.

SUMMARY OF THE INVENTION

In accordance with the present invention a cam operated device is provided for rigidly securing printed circuit boards to a chasis in spaced parallel relationship to one another to prevent electronic components on the printed circuit boards from contacting an adjacent printed circuit board when subjected to shock or vibration.

The cam-lock shaft is inserted into position by pushing the cam-lock shaft axially through an opening or bore located at one side of a housing containing the assembled electronic equipment or components. The bore has the shape of a cam lobe and is just large enough to allow the lobes on the cam-lock shaft, when properly aligned, to pass through the bore. When fully inserted into the housing, the opposite end of the cam-lock shaft will be supported or rest in a second bore located on the opposite side of the housing.

The cam-lock shaft is then rotated 180° to an engagement position in which the sides or edges of the lobes of the cam-lock shaft engage the edges of apertures in the printed circuit boards, thereby securing the printed circuit boards in place. The end of the cam-lock shaft also may be fastened in place using a screw fastener to prevent the rotation of the cam-lock shaft.

It is therefore an object of the present invention to provide a cam-actuated support device for rigidly holding several printed circuit boards in spaced parallel relationship while maintaining a condition of correct alignment or register of one circuit board relative to an adjacent circuit board.

It is another object of the present invention to provide a cam actuated spacing and support device for circuit boards in which the edges of the cam lobes of the cam lock device grip the edges of apertures in the circuit boards to secure the circuit boards in place under conditions when the assembly is subjected to high shock and vibration.

Other objects, features and advantages of the present invention will become apparent to those having ordinary skill in the art upon a reading of the description when taken in conjunction with the drawings.

BRIEF DESCRIPTION OF THE DRAWINGS

FIGS. 3a and 3b are views of the cam-lock bearing block from the left end.

FIG. 4 is a view of the cam-lock bearing block from the right end.

FIG. 5 is a view of the cam-lock end plug.

DETAILED DESCRIPTION OF THE INVENTION

Figure 1:
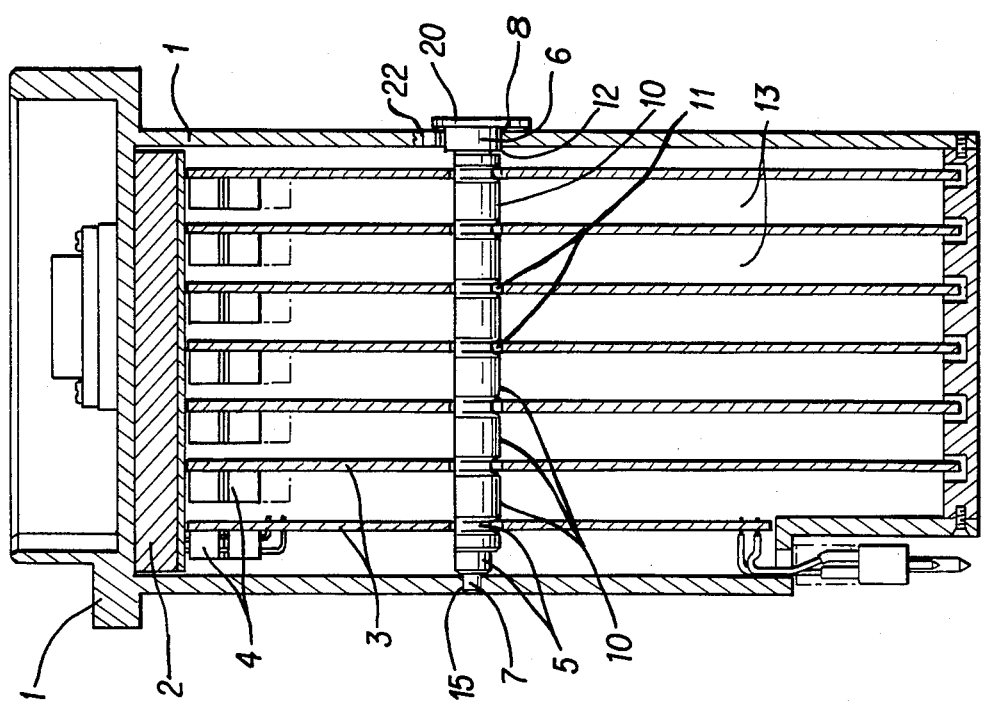
FIG. 1 is a section view of the cam-lock in the unlocked position.
Figure 2:
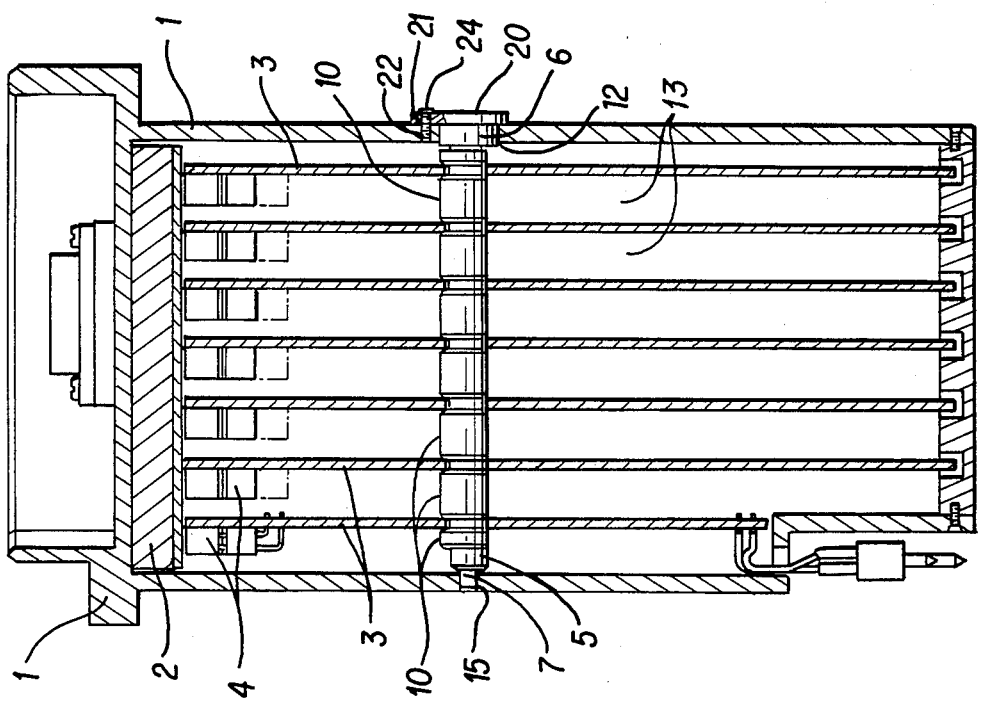
FIG. 2 is a section view of the cam-lock in the locked position.

FIGS. 1 and 2 illustrate the cam-lock electronic circuit board spacing and support device in accordance with the preferred embodiment. A housing upon which circuit boards are assembled is shown at 1. Mounted upon the housing is a first circuit board 2 or motherboard. A number of other circuit boards 3 or daughter boards are affixed at approximately right angles to the motherboard using electronic connectors 4. Housing 1 has two bearing surfaces 12 and 15. The cam-lock shaft 5 has end journals 6 and 7 which, when inserted into housing 1, will rest on bearing surfaces 12 and 15. Cam-lock shaft 5 has lobes 10 that are aligned in parallel with one another and also at the same angle with respect to the central axis of shaft 5. As is shown in FIG. 1, printed circuit boards or daughter boards 3 also have apertures or openings 11 within daughter boards 3, through which the cam-lock shaft 5 is inserted when the device is assembled.

Referring to FIGS. 3a and 3b, it is illustrated that journaled end 7 of cam-lock shaft 5 has circular shape such that it mates with bore 9 which is slightly larger in diameter then journal 7. In the preferred embodiment of the cam-lock shaft 5, an end cap shown in FIGS. 1 and 2 is rigidly affixed to journaled end 6 of cam-lock shaft 5. However, in FIG. 4 another embodiment is shown wherein journaled end 6 of cam-lock shaft 5 has a key slot 16 that is cut parallel and in line with cam lobes 10. A separate end plug or cam-lock plug 18 is designed such that it will fit into bore 8. Bore 8 is designed such that its diameter is slightly larger than the major diameter of lobes 10 as is shown in FIG. 4.

To assemble and operate the cam-lock device, motherboard 2 is first assembled onto housing 1. Daughterboards 3 are then attached to the motherboard using connectors 4. Cam-lock shaft 5 is pushed axially through bore 8 of bearing 12 inserting the end containing journal 7 first. Lobes 10 of shaft 5 are positioned downward such that they are turned away from the mother board 2. The cam-lock shaft is pushed axially through housing 1 and through openings 11 in daughter boards 3 until journal 7 is fully inserted into bore 9 of bearing 15. At this position the lobes 10 of shaft 5 should be aligned such that the lobes are directly under the spacing or clearance areas 13 between daughterboards 3 as is shown in FIG. 1. Cam-lock shaft 5 is then rotated 180° such that the lobes 10 engage the edges of the openings 11 in the circuit boards 3. The edges of the opening 11 in the circuit boards 3 are now trapped or locked between the lobes 10 of cam-lock shaft 5 as is shown in FIG. 2. Lobes 10 may also be chamfered to insure the proper engagement of the edges of the openings 11 in circuit boards 3. End cap 20 may also be fastened in place to housing 1 by inserting screw 24 into opening 21 in cam-lock 20 and threaded socket 22 in housing 1.

In the alternate embodiment illustrating the separate end plug 18, as shown in FIG. 5, after the cam-lock shaft 5 is rotated the 180° to cause lobes 10 openings 11 in circuit boards 3, cam-lock plug 18 is inserted into bore 8 with mating flange 19 inserted into key slot 16. This locks cam-lock shaft 5 in place and prevents its rotation. Cam-lock plug 18 may also be fastened in place to housing 1 by inserting screw 24 into opening 21 in cam-lock plug 18 and threaded socket 22 in housing 1.

While embodiments of the invention have been described in detail, it will be obvious to those skilled in the art that the invention may be practiced otherwise without departing from its spirit and scope.

I claim:

1. A device for maintaining the proper spacing for circuit boards comprising:
    a housing for mounting electronic circuit boards;
    a chassis circuit board mounted onto said housing;
    a plurality of circuit boards having one end secured to said chassis circuit board at a right angle, and having apertures centrally located within said circuit boards; and
    a cam-lock shaft mounted onto said housing wherein adjacent lobes of said cam-lock shaft are positioned to engage the edges of said apertures of said circuit boards, thereby securing said circuit boards in proper spaced alignment with adjacent circuit boards.

2. The device of claim 1 further including a means for locking said cam-lock shaft in place such that said lobes of said cam-lock shaft are prevented from rotating.

3. The device of claim 2 wherein said means for locking said cam-lock shaft in place comprises inserting a fasting device such as screw into an end cap of said cam-lock shaft.

4. The device of claim 3 wherein said end cap is removeable from said cam-lock shaft.

5. The device of claim 1 wherein the edges of the lobes of the cam-lock shaft are chambered to facilitate the engagement of said lobes with circuit boards.

* * * * *